United States Patent
Shoham et al.

(10) Patent No.: US 10,387,251 B2
(45) Date of Patent: Aug. 20, 2019

(54) ERROR DETECTION AND CORRECTION IN A CONTENT-ADDRESSABLE MEMORY USING SINGLE-BIT POSITION LOOKUP OPERATIONS

(71) Applicant: Cisco Technology, Inc., San Jose, CA (US)

(72) Inventors: Doron Shoham, Shoham (IL); Ilan Lisha, Hadera (IL)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/651,605

(22) Filed: Jul. 17, 2017

(65) Prior Publication Data
US 2019/0018735 A1    Jan. 17, 2019

(51) Int. Cl.
| | | |
|---|---|---|
| G06F 11/00 | (2006.01) | |
| G06F 11/10 | (2006.01) | |
| H03M 13/05 | (2006.01) | |
| G06F 16/903 | (2019.01) | |
| H03M 13/09 | (2006.01) | |

(52) U.S. Cl.
CPC ...... *G06F 11/1076* (2013.01); *G06F 11/1048* (2013.01); *G06F 16/90339* (2019.01); *H03M 13/05* (2013.01); *H03M 13/09* (2013.01)

(58) Field of Classification Search
None
See application file for complete search history.

(56) References Cited

U.S. PATENT DOCUMENTS

| | | | |
|---|---|---|---|
| 5,491,703 A | * | 2/1996 | Barnaby ............. G11C 15/04 365/49.17 |
| 5,761,222 A | * | 6/1998 | Baldi ............. G06F 11/1072 714/773 |
| 6,374,326 B1 | | 4/2002 | Kansal et al. |
| 6,389,506 B1 | | 5/2002 | Ross et al. |
| 6,526,474 B1 | | 2/2003 | Ross |
| 6,535,951 B1 | | 3/2003 | Ross |

(Continued)

OTHER PUBLICATIONS

Bremler-Barr et al., PEDS: A Parallel Error Detection Scheme for TCAM Devices, IEEE/ACM Transaction on Networking, vol. 18, No. 5, Oct. 2010, IEEE, New York, New York (eleven pages).

*Primary Examiner* — Daniel F. McMahon
(74) *Attorney, Agent, or Firm* — The Law Office of Kirk D. Williams

(57) ABSTRACT

In one embodiment, error detection and correction is performed in a content-addressable memory using single-bit position lookup operations. A lookup operation is performed generating a resultant match vector reflective of matching a single-bit position within each of multiple content-addressable memory entries against a corresponding bit value at the single-bit position within a lookup word. The resultant match vector is processed to determine if there are any errors and typically which entries contain a wrong bit value. The correct match vector (e.g., having no errors) is determined from the correct stored matching values (e.g., those used to program the content-addressable memory entries) and the value at the single-bit position within the lookup word. One embodiment compares the correct and resultant match vectors, while one embodiment performs this comparison using an error-correcting code of the correct match vector.

21 Claims, 8 Drawing Sheets

(56) References Cited

U.S. PATENT DOCUMENTS

| | | | |
|---|---|---|---|
| 6,606,681 B1 | 8/2003 | Uzun | |
| 6,715,029 B1 | 3/2004 | Trainin et al. | |
| 6,738,862 B1 | 5/2004 | Ross et al. | |
| 6,871,262 B1 | 3/2005 | Oren et al. | |
| 6,987,684 B1* | 1/2006 | Branth | G06F 11/1064 |
| | | | 365/189.15 |
| 7,103,708 B2 | 9/2006 | Eatherton et al. | |
| 7,257,672 B2 | 8/2007 | Shoham et al. | |
| 7,260,673 B1 | 8/2007 | Ross | |
| 7,290,083 B2 | 10/2007 | Shoham et al. | |
| 7,305,519 B1* | 12/2007 | Nagaraj | G06F 11/1064 |
| | | | 711/108 |
| 7,345,897 B2 | 3/2008 | Krishnan et al. | |
| 7,349,230 B2 | 3/2008 | Parthasarathy et al. | |
| 7,350,131 B2 | 3/2008 | Trainin | |
| 8,738,977 B2* | 5/2014 | Brown | G11C 29/56 |
| | | | 714/704 |
| 8,887,026 B2 | 11/2014 | Bremler-Barr et al. | |
| 2006/0080498 A1* | 4/2006 | Shoham | G06F 11/1064 |
| | | | 711/108 |
| 2008/0049522 A1* | 2/2008 | Cohen | G11C 15/00 |
| | | | 365/189.07 |
| 2013/0139033 A1* | 5/2013 | Yu | G06F 11/1048 |
| | | | 714/766 |

\* cited by examiner

ERROR DETECTION AND CORRECTION IN A CONTENT-ADDRESSABLE MEMORY USING SINGLE-BIT POSITION LOOKUP OPERATIONS

TECHNICAL FIELD

The present disclosure relates generally content-addressable memories, including those used in forwarding packets in a network based on lookup results (e.g., longest prefix matching) in a content-addressable memory (e.g., a binary or ternary content-addressable memory).

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Content-addressable memories (e.g., binary and ternary content-addressable memories) are particularly useful in performing lookup operations in determining how to forward a packet in a network by a packet switching device.

BRIEF DESCRIPTION OF THE DRAWINGS

The appended claims set forth the features of one or more embodiments with particularity. The embodiment(s), together with its advantages, may be understood from the following detailed description taken in conjunction with the accompanying drawings of which:

DESCRIPTION OF EXAMPLE EMBODIMENTS

1. Overview

Figure 1A:
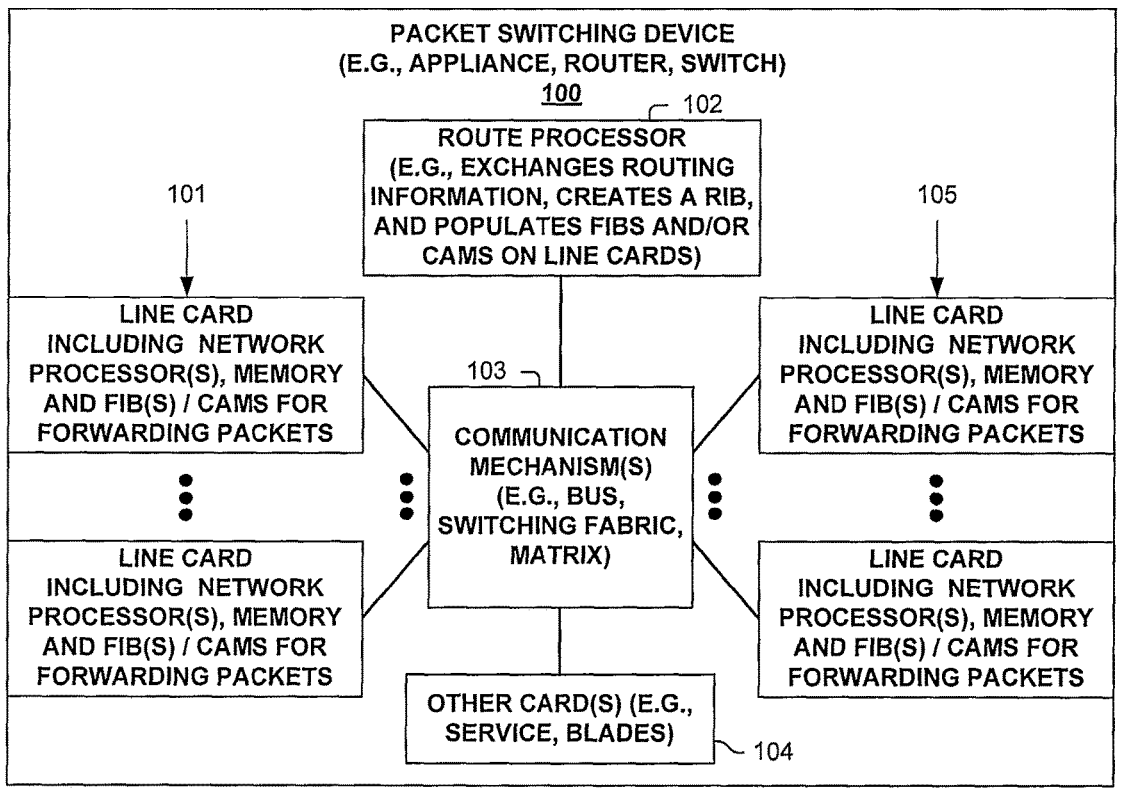
FIG. 1A illustrates a packet switching device including one or more content-addressable memories according to one embodiment.

Disclosed are, inter alia, methods, apparatus, computer-storage media, mechanisms, and means associated with error detection and correction in a content-addressable memory using single-bit position lookup operations.

One embodiment performs a lookup operation in a content-addressable memory to generate a resultant match vector reflective of matching a single-bit position within each of multiple content-addressable memory entries of the content-addressable memory against a corresponding bit value at the single-bit position within a lookup word. The resultant match vector is processed to determine if there are any errors, and typically which entries contain an error/wrong bit value (with these entries being corrected in response). The correct match vector (e.g., having no errors) is determined from the correct stored matching values (e.g., those used to program the content-addressable memory entries) and the value at the single-bit position (i.e., '1' or '0') within the lookup word. One embodiment compares the correct and resultant match vectors, with a bit difference identifying an error detected in an entry corresponding to that bit position of different values. One embodiment performs this comparison using an error-correcting code of the correct match vector (e.g., computed beforehand and stored in memory) which significantly reduces the amount of memory required to store a representation of the correct match vector for all bit positions for each bit value (i.e., '1' or '0') of the lookup word. To verify the integrity of all matching results for all entries, each single bit position of the stored content-addressable memory entries is checked using a lookup operation for a lookup value of one and a lookup operation for a lookup value of zero.

2. Description

Disclosed are, inter alia, methods, apparatus, computer-storage media, mechanisms, and means associated with error detection and correction in a content-addressable memory (e.g., binary, ternary) using single-bit position lookup operations. As used herein, the term "content-addressable memory" refers to a hardware-based associative memory (e.g., a memory in which data items are accessed not on the basis of a fixed address or location but by analysis of their content) in which bits (e.g., cell values) of multiple content-addressable memory entries are simultaneously compared against corresponding bits of a lookup word. Further, the term "content-addressable memory" refers to variations thereof, such as, but not limited to a binary content-addressable memory and a ternary content-addressable memory.

Embodiments described herein include various elements and limitations, with no one element or limitation contemplated as being a critical element or limitation. Each of the claims individually recites an aspect of the embodiment in its entirety. Moreover, some embodiments described may include, but are not limited to, inter alia, systems, networks, integrated circuit chips, embedded processors, ASICs, methods, and computer-readable media containing instructions. One or multiple systems, devices, components, etc., may comprise one or more embodiments, which may include some elements or limitations of a claim being performed by the same or different systems, devices, components, etc. A processing element may be a general processor, task-specific processor, a core of one or more processors, or other co-located, resource-sharing implementation for performing the corresponding processing. The embodiments described hereinafter embody various aspects and configurations, with the figures illustrating exemplary and non-limiting configurations. Computer-readable media and means for performing methods and processing block operations (e.g., a processor and memory or other apparatus configured to perform such operations) are disclosed and are in keeping with the extensible scope of the embodiments. The term "apparatus" is used consistently herein with its common definition of an appliance or device.

The steps, connections, and processing of signals and information illustrated in the figures, including, but not limited to, any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process said read value—the value must be obtained prior to processing it, although some of the associated processing may be performed prior to, concurrently with, and/or after the read operation). Also, nothing described or referenced in this document is admitted as prior art to this application unless explicitly so stated.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the terms "first," "second," etc., are typically used herein to denote different units (e.g., a first element, a second element). The use of these terms herein does not necessarily connote an ordering such as one unit or event occurring or coming before another, but rather provides a mechanism to distinguish between particular units. Moreover, the phrases "based on x" and "in response to x" are used to indicate a minimum set of items "x" from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps. Finally, the term "particular machine," when recited in a method claim for performing steps, refers to a particular machine within the 35 USC § 101 machine statutory class.

Figure 1B:
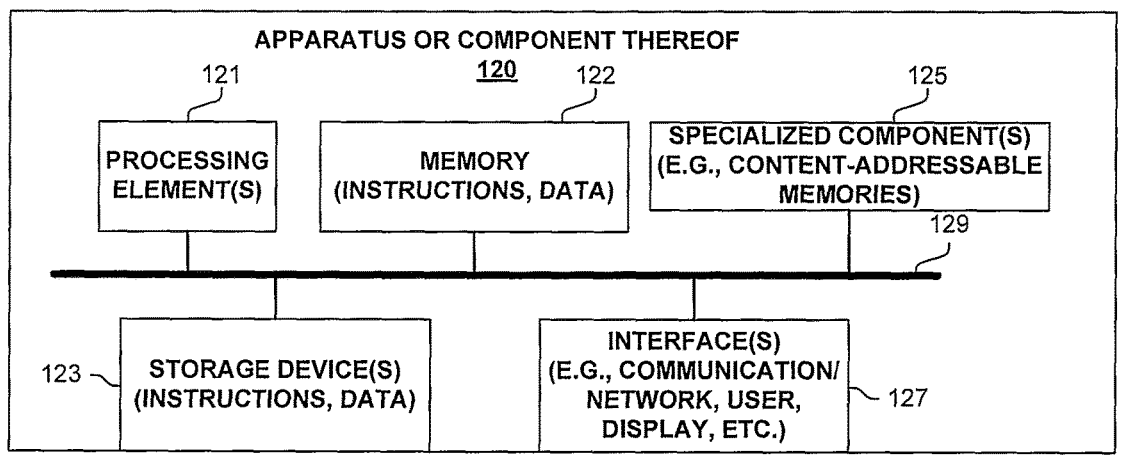
FIG. 1B illustrates an apparatus including one or more content-addressable memories according to one embodiment.

FIGS. 1A-B and their discussion herein are intended to provide a description of various exemplary packet switching systems used according to one embodiment that uses one or more error detection and correction-protected content-addressable memories, such as, but not limited to, in performing a longest prefix or exact match operation in determining how to forward a packet in a network.

One embodiment of a packet switching device 100 is illustrated in FIG. 1A. As shown, packet switching device 100 includes multiple line cards 101 and 105, each with one or more network interfaces for sending and receiving packets over communications links (e.g., possibly part of a link aggregation group), and with one or more processing elements that are used in one embodiment associated with error detection and correction in a content-addressable memory using single-bit position lookup operations. Packet switching device 100 also has a control plane with one or more processing elements 102 for managing the control plane and/or control plane processing of packets associated with error detection and correction in a content-addressable memory using single-bit position lookup operations. Packet switching device 100 also includes other cards 104 (e.g., service cards, blades) which include processing elements that are used in one embodiment to process (e.g., forward, drop, manipulate) packets associated with error detection and correction in a content-addressable memory using single-bit position lookup operations, and some communication mechanism 103 (e.g., bus, switching fabric, and/or matrix, etc.) for allowing its different entities 101, 102, 104 and 105 to communicate.

Line cards 101 and 105 typically perform the actions of being both an ingress and egress line card, in regards to multiple other particular packets and/or packet streams being received by, or sent from, packet switching device 100. In one embodiment, network processors on line cards 101 and/or 105 use one or more error detection and correction-protected content-addressable memories to determine packet forwarding information (e.g., based on a lookup operation of a destination address, label or some other value) in a forwarding information base (FIB), and forward (or process in a different manner) the packet accordingly.

FIG. 1B is a block diagram of an apparatus 120 used in one embodiment associated with error detection and correction in a content-addressable memory using single-bit position lookup operations. In one embodiment, apparatus 120 performs one or more processes, or portions thereof, corresponding to one of the flow diagrams illustrated or otherwise described herein, and/or illustrated in another diagram or otherwise described herein.

In one embodiment, apparatus 120 includes one or more processor(s) 121 (typically with on-chip memory), memory 122, storage device(s) 123, specialized component(s) 125 (e.g. optimized hardware such as for performing lookup and/or packet processing operations, such as, but not limited to using one or more error detection and correction-protected content-addressable memories, etc.), and interface(s) 127 for communicating information (e.g., sending and receiving packets, user-interfaces, displaying information, etc.), which are typically communicatively coupled via one or more communications mechanisms 129 (e.g., bus, links, switching fabric, matrix), with the communications paths typically tailored to meet the needs of a particular application.

Various embodiments of apparatus 120 may include more or fewer elements. The operation of apparatus 120 is typically controlled by processor(s) 121 using memory 122 and storage device(s) 123 to perform one or more tasks or processes. Memory 122 is one type of computer-readable/computer-storage medium, and typically comprises random access memory (RAM), read only memory (ROM), flash memory, integrated circuits, and/or other memory components. Memory 122 typically stores computer-executable instructions to be executed by processor(s) 121 and/or data which is manipulated by processor(s) 121 for implementing functionality in accordance with an embodiment. Storage device(s) 123 are another type of computer-readable medium, and typically comprise solid state storage media, disk drives, diskettes, networked services, tape drives, and other storage devices. Storage device(s) 123 typically store computer-executable instructions to be executed by processor(s) 121 and/or data which is manipulated by processor(s) 121 for implementing functionality in accordance with an embodiment.

Figure 2A:
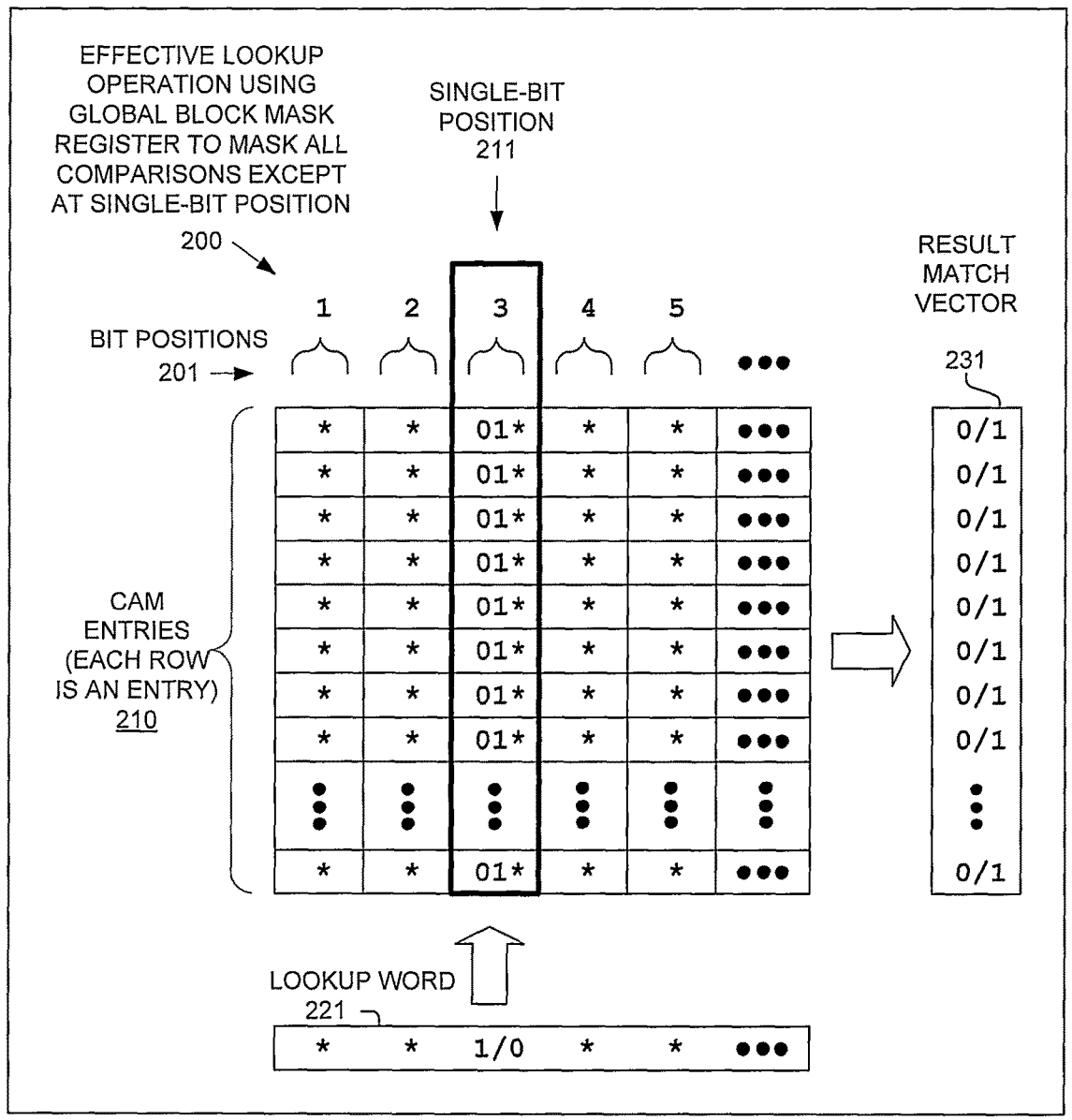
FIG. 2A illustrates a single-bit position lookup operation in a content-addressable memory according to one embodiment.

FIG. 2A illustrates a single-bit position lookup operation 200 according to one embodiment. Shown in FIG. 2A are content-addressable memory entries 210 having different bit positions 201. Single-bit position 211 represents one of these bit positions 201 (specifically third most high-order bit as shown) of each of content-addressable memory entries 210. In one embodiment, multiple content-addressable memory entries 210 represent a block/bank of entries, with the error detection and correction using single-bit position lookup operations performed on a per or multiple block/bank basis.

In one embodiment, a global mask value (e.g., that stored in a global mask register or block mask register beforehand or received for the single-bit lookup operation 200) is used to mask the lookup operation on all bit positions except the single-bit position 211. The use of a '*' in FIG. 2A denotes a wildcard or don't care value, either stored or effective (e.g., result of being masked) for the lookup operation 200 being shown. In other words and as shown, result match vector 231 generated by lookup operation 200 is that of the matching of single-bit position 211 of each of CAM entries 210 compared to the value of single-bit position 211 of lookup word 221. Each bit of result match vector 231 reflects whether there is a match or not a match for the value stored in the single bit-position 211 of each of CAM entries 210 compared to the current value of zero or one of single-bit position 211 of lookup word 221.

Figure 2B:
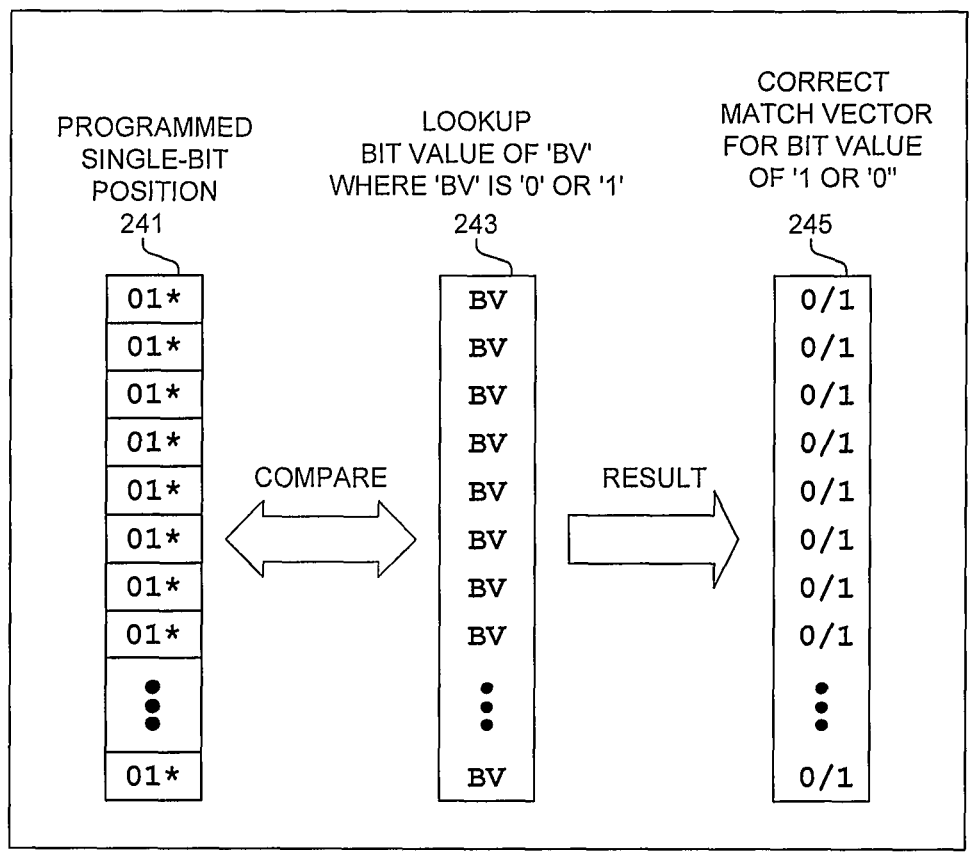
FIG. 2B illustrates a process according to one embodiment.
Figure 2C:
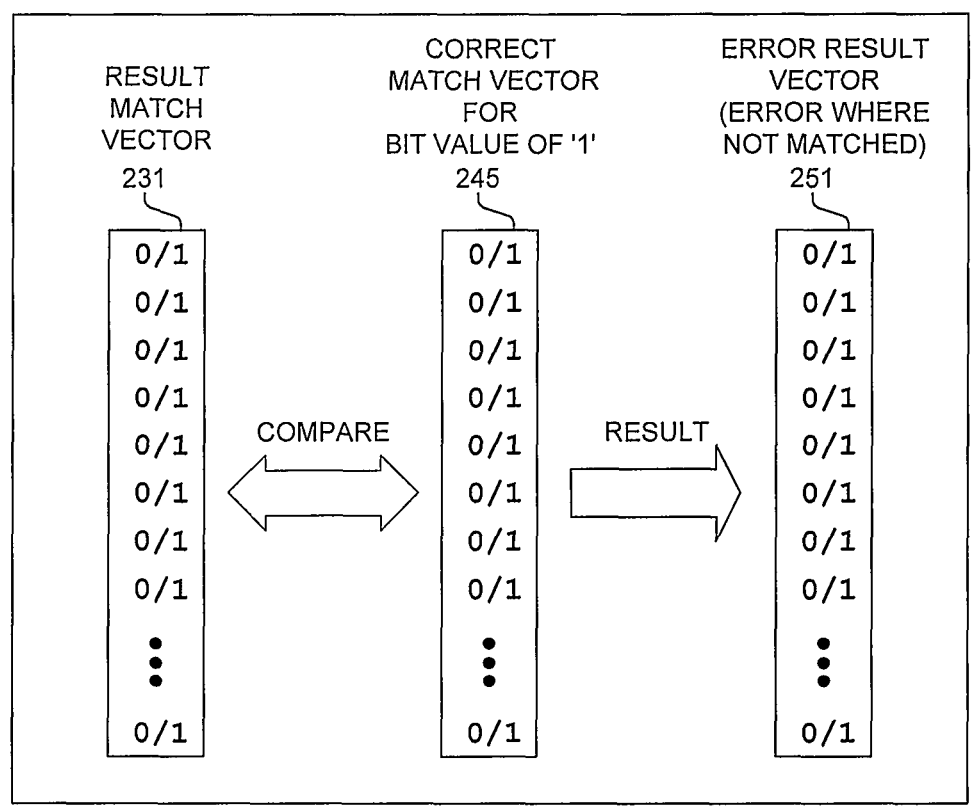
FIG. 2C illustrates a process according to one embodiment.
Figure 2D:
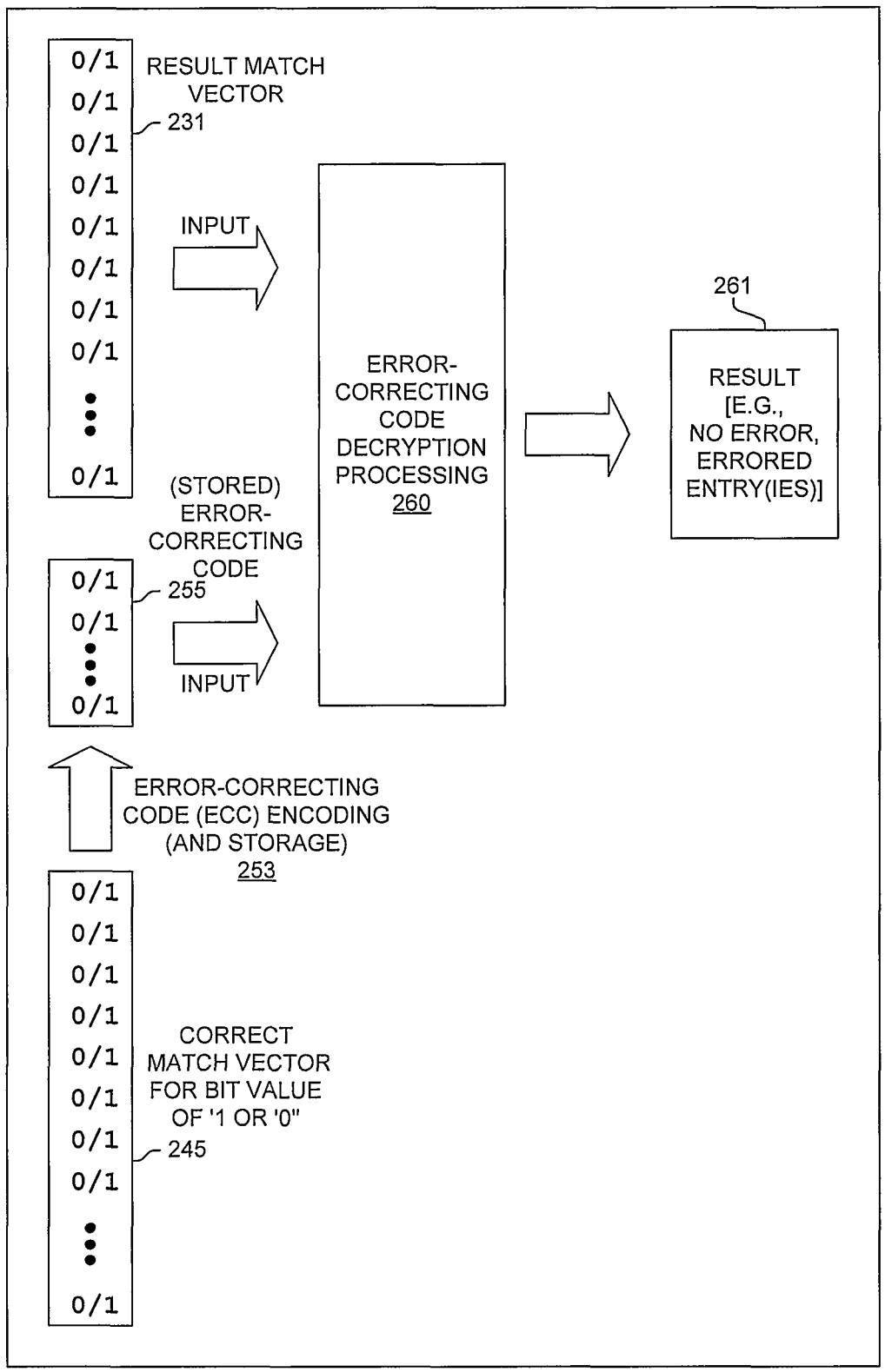
FIG. 2D illustrates a process according to one embodiment.

Each of the combinations of FIGS. 2B AND 2C, and FIGS. 2B and 2D illustrates error-detection processing to determine whether, and possibly which, one or more content-addressable memory entries 210 (FIG. 2A) generated a matching error in single-bit position 211 (FIG. 2A) for the single-bit position lookup operation 200 (FIG. 2A) according to one embodiment.

FIG. 2B illustrates the determination of the non-errored, correct match vector 245 according to one embodiment. As shown, correct match vector 245 is determined based on the correct programming of single bit-position 241 (which would be the same as single-bit position 211 if there are no bit changes) across each of CAM entries 210 (FIG. 2A). Each bit position of correct match vector 245 is compared against the same value (i.e., one or zero, and represented as vector 243 in FIG. 2B), with this value of one or zero being the same as single bit-position 211 of lookup word 221 (FIG. 2A).

In one embodiment, the processing illustrated in FIG. 2B is performed before a corresponding lookup operation 200 (FIG. 2A), with the correct match vector stored in memory for each single bit-position of stored matching entries in a content-addressable memory for each value of one and zero. In one embodiment, the processing illustrated in FIG. 2B is performed in real-time, which reduces storage requirements. In one embodiment, each of correct match vectors is encoded, such as, but not limited to, as an error-correcting code which reduces the amount of storage required to store all of the error-correcting codes, while typically preserving the capability of identifying which entry is corrupt (at least in case of a single bit error). Different techniques for constructing the error-correcting code is used to conform to the needs of one embodiment (e.g., based on the expected error rate and the number of simultaneously stored bit errors in the content-addressable memory entries).

As shown in FIG. 2C and in one embodiment, result match vector is 231 (generated as shown in FIG. 2A by a single-bit position lookup operation 200) is compared against correct match vector 245 (FIG. 2B) to generate error result vector 251. Each bit difference, if any, identifies a corrupt CAM entry 210 (of FIG. 2A) in a content-addressable entry position corresponding to the location of the bit difference in error result vector 251. Thus, a single (only one) lookup operation 200 (FIG. 2A) on a single bit-position 211 of CAM entries 210 and processing of the result match vector 231 (e.g., comparison to a correct match vector 245 (FIG. 2C) (or processing using some encoding thereof such as an error-correcting code) identifies one or more bit errors (if any).

As shown in FIG. 2D and in one embodiment, error-correcting code decryption processing 260 is performed on result match vector is 231 (generated as shown in FIG. 2A by a single-bit position lookup operation 200) and error correction code 255 to result 261 (e.g., no error, one or more error entries and typically which entries are errored if a small number of errors detected). Error correction code 255 is generated by error-correcting encoding processing 253 from correct match vector 245 (generated in FIG. 2B according to one embodiment). In one embodiment, generation of correct match vector 245 (FIG. 2B), error-correcting code processing 253 to generate error correction code 255, and storage of error correction code 255 stored in memory are performed prior to single-bit position lookup operation 200 (FIG. 2A). In one embodiment, the error correction code for inclusively between none and all single-bit positions for each of a lookup bit value of one and zero is determined and stored in memory so the corresponding error correction code is retrievable from memory as needed for an error detection operation.

In one embodiment, each single lookup operation 200 (FIG. 2A) and subsequent processing (e.g., according to FIGS. 2B and 2C, according to FIGS. 2B and 2D) is independent of the determination of errors in other single-bit positions and/or other values of the single-bit position in the lookup word. To check all bits of all entries of a content-addressable memory, the number of lookup operations required is the width of the entries (e.g., the number of single-bit positions) times two (a lookup operation each lookup word bit value of zero and one). Further, this error detection discipline does not require any extra bits of in a content-addressable memory entry to be used to store parity or other error detection or correction code bits, as this error detection disciple requires lookup operations on only the native comparison data of each entry according to one embodiment. Further, one embodiment eliminates a requirement for error-correction code cells (e.g., cells of each content-addressable memory entry not used in comparison operations, but used for error detection purposes).

Figure 3:
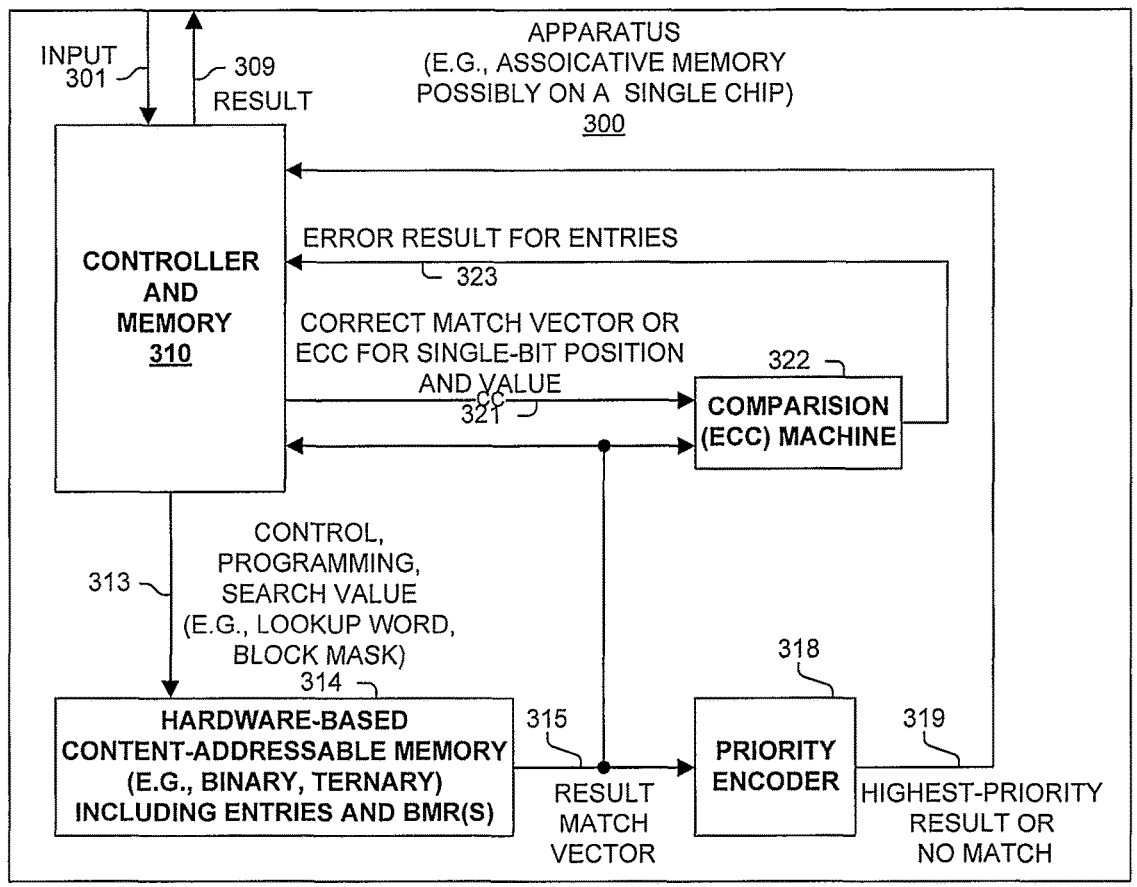
FIG. 3 illustrates an apparatus including a content-addressable memory according to one embodiment.

FIG. 3 illustrates an apparatus 300 including a content-addressable memory 314 according to one embodiment. In one embodiment, controller and memory 310 (typically referred to herein as simply controller 310) communicates information (313) to content-addressable memory, with this information 313 including, but not limited to, control information, programming information, search information.

For a normal lookup operation request, apparatus 300 receives input 301 (e.g., a lookup word, lookup word and global mask value, tuple fields of a packet header) on which to perform a lookup operation either directly or after processing to determine the lookup word. The lookup word and possibly a global mask value (directly or indirectly such as an index selecting a stored value or global bitmask register) is provided (313) to content-addressable memory 314, which performs the lookup operation resulting in match vector 315. Priority encoder 318 determines the highest-priority matching value of match vector 315, if one, and signals (319) the highest-priority result or no match determined to controller 310, which signals a corresponding result 309. Controller 310 also receives the entire match vector 315 which it can use in generating result 309 (e.g., the entire match vector 315 and not just the highest-priority matching values 319).

One embodiment of apparatus 300 performs error detection and correction in a content-addressable memory using single-bit position lookup operations. In one embodiment, this error detection and correction is performed in background (e.g., when a normal lookup operation is not being performed), but at a rate commensurate with quick identification and correction of errors based on an expected error generation rate.

In performing error detection and correction, controller 310 selects a single-bit position and comparison value ('1' or '0'), and generates and communicates (313) a lookup word with the comparison value at the single-bit position and a corresponding global bit mask value such that result match vector 315 is determined by the result of comparison operations between the single-bit position of the entries of content-addressable memory 314 and the single bit-position of the lookup word.

Controller 310 communicates (321) the correct match vector (e.g., fully-expanded or encoded vector retrieved from its memory) and provides to comparison machine 322, which also receives the resultant match vector 315. Comparison machine 322 identifies zero or more bit position errors 323 identified by differences between the correct match vector (full or encoded) and actual result vector. In response, controller 310 reprograms (313) any detected errored entries of content-addressable memory 314 with the correct entry value. In one embodiment, when multiple errors are detected, then all content-addressable memory entries of content-addressable memory 314 are re-programmed. In one embodiment, content-addressable memory 314 includes multiple blocks/banks of content-addressable memory entries. When multiple errors are detected in a block/bank of content-addressable memory entries, then the entire block/bank of content-addressable memory entries is re-programmed.

In one embodiment, comparison machine 322 is a hardware-optimized comparison machine which produces the comparison result 323 faster than could be done by controller 310. In one embodiment, controller 310 stores in its memory an encoding of each correct match vector, typically using an error-correcting code (ECC) so that one or more errored bit positions (corresponding to entries of content-addressable memory 314) can be determined. Thus, in one embodiment, error-correcting machine 322 receives the ECC encoding (321) of the correct match vector and resultant match vector 315, and determines zero differences (no errored entries), or one or more entries while typically identifying which entries (at least when there is a single or small number of errors detected). In response, controller 310 reprograms (313) (i.e., corrects) any detected errored entries of content-addressable memory 314. In one embodiment, when multiple errors are detected, then all corresponding content-addressable memory entries (e.g., all or a block/bank) of content-addressable memory 314 are re-programmed.

One embodiment uses a content-addressable memory with a block/bank size of 4K with an entry width of eighty bits. Thus, to check each bit of each entry requires two times eighty which equals 160 single-bit position lookup operations. In one embodiment, each of the correct match vectors of 4K bits is natively stored. In one embodiment, an error-correcting code is used to reduce the 4K bits for each entry to approximately thirteen bits which allows the detection of zero, one, or more than one bit errors (signaled as error result 323) when these thirteen ECC bits (321) and 4K result match vector 315 are processed by ECC machine 322 (ECC hardware decryption logic). One embodiment uses a different error-correcting code such as, but not limited to, one commensurate with the amount of memory available in controller and memory 310, the expected error rate within content-addressable memory 314, the fabrication size and/or other factor such as heat generation, power consumption, etc. of apparatus 300.

Figure 4:
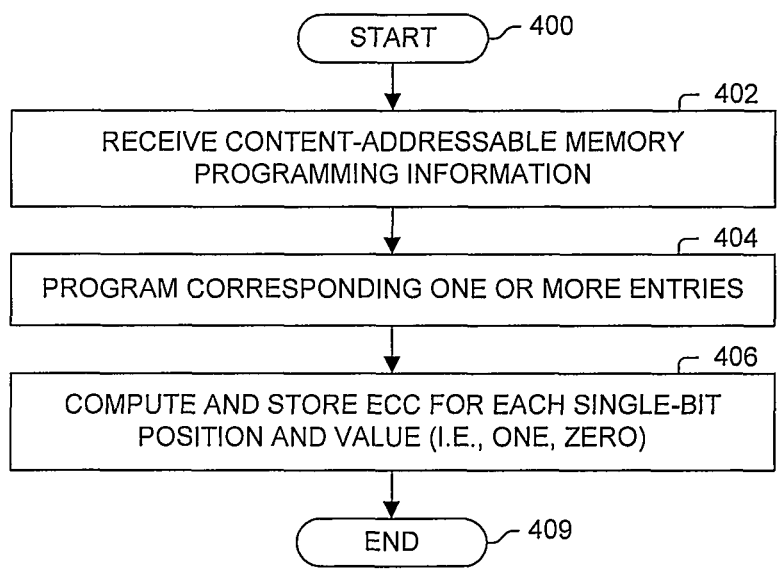
FIG. 4 illustrates a process according to one embodiment.

FIG. 4 illustrates a process according to one embodiment. Processing begins with process block 400. In process block 402, content-addressable memory programming information is received. In process block 404, corresponding entries of the content-addressable memory are programmed. In process block 406, the error-correcting code for each single-bit position and lookup comparison value of zero and one is determined and stored. In one embodiment, the native correct match vectors are stored or accessible from this programming information, with the native correct match vectors used in the processing to determine any errors, or for computing the error-correcting code during runtime (e.g., rather than computing and storing beforehand). Processing of the flow diagram of FIG. 4 is complete as indicated by process block 409.

Figure 5:
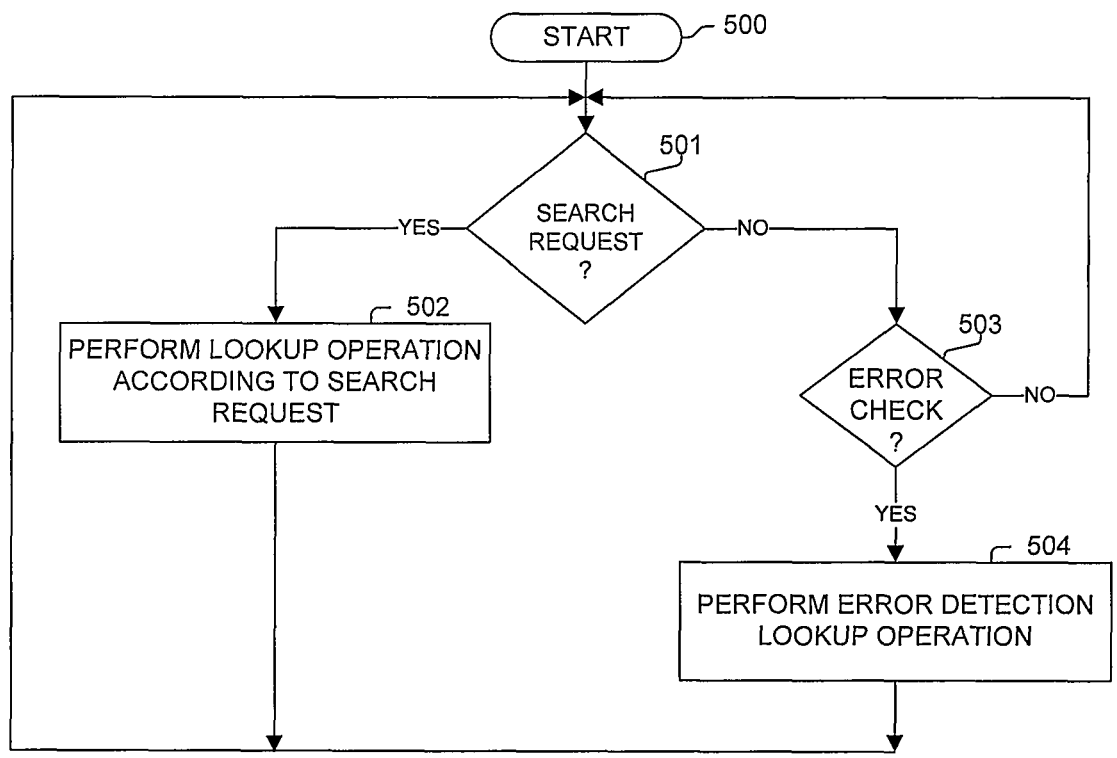
FIG. 5 illustrates a process according to one embodiment.

FIG. 5 illustrates a process according to one embodiment. Processing begins with process block 500. As determined in process block 501, in response to a content-addressable memory search request being available, then the lookup operation based on the search request is performed in process block 502; otherwise, processing proceeds to process block 503. As determined in process block 503, if an error detection and correction operation should be performed (e.g., as a timer has expired, or another event occurred), then in process block 504 a single-bit error detection and correction operation is performed in process block 504. Processing returns to process block 501.

Figure 6:
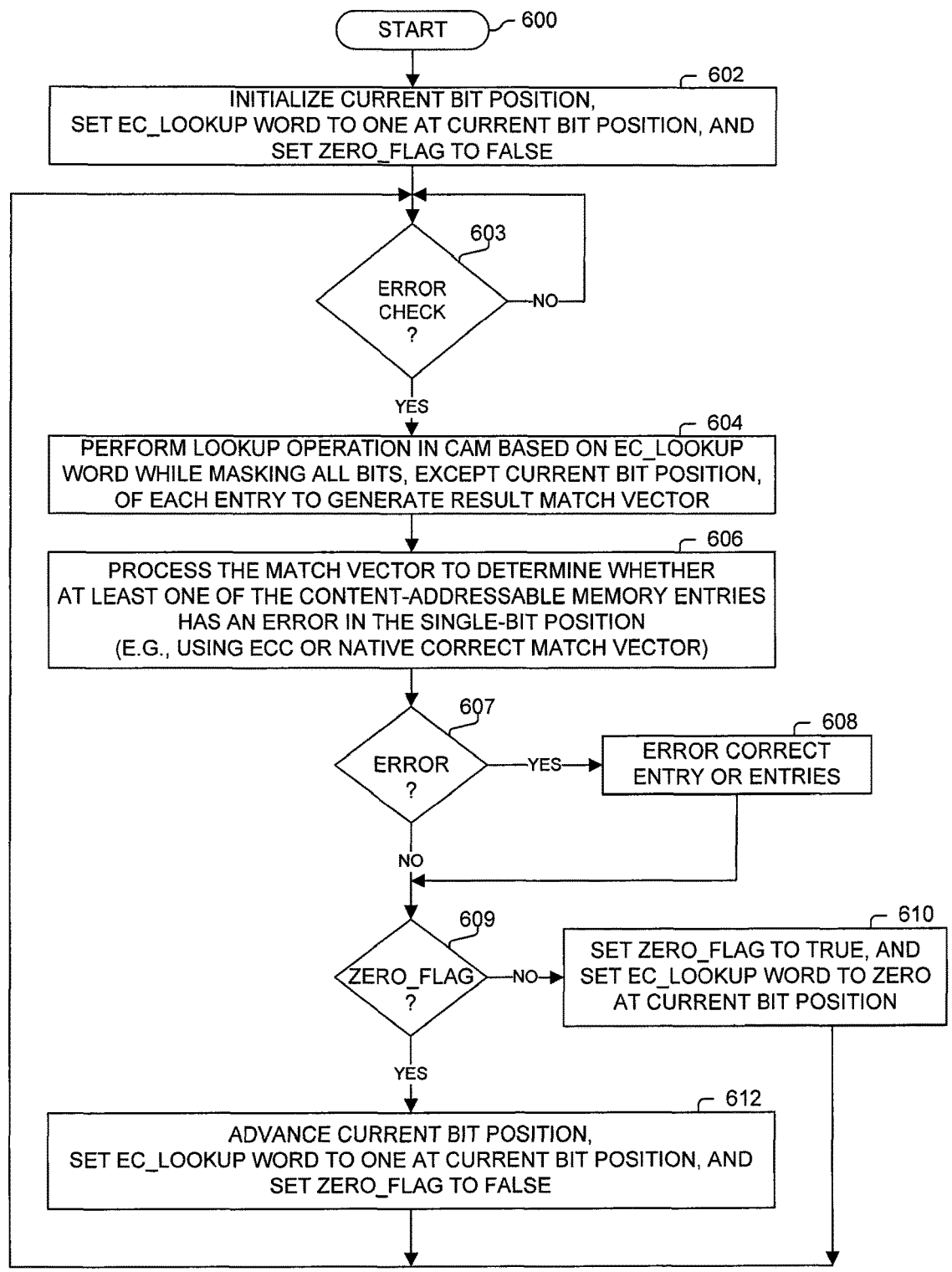
FIG. 6 illustrates a process according to one embodiment.

FIG. 6 illustrates a process according to one embodiment. Processing begins with process block 600. In illustrating this process, a variable current bit position is used to identify a current bit position on which to perform a single-bit lookup operations. This value is changed typically in a predetermined manner to sequence through all bit positions of the content-addressable memory entries. Additionally, zero_flag is used to indicate whether to perform a lookup operation using a single-bit position of one (first time) or zero (second time) at the current bit position. Finally, EC_lookup word is the lookup word used in the single-bit lookup operation, with only its value at the current bit position being important as the search masks the results of comparison operations at other bit positions.

In process block 602, the current bit position is initialized, the bit of EC_lookup word at current bit position is set to one, and zero_flag is set to false, and processing continues to process block 603 to wait until an error detection and correction operation should be performed (e.g., as a timer has expired, or another event occurred), then perform a single-bit position error determination and correction operation of process blocks 604-612.

In response to determining in process block 603 to perform a single-bit position error determination and correction operation, processing of the flow diagram of FIG. 6 continues with process block 604. A single-bit position lookup operation is performed on the content-addressable memory entries with a lookup word of EC_lookup word with all bit positions masked except the current bit position to generate the result match vector. In process block 606, the result match vector is processed to determine whether at least one of the content-addressable memory entries has an error in the single-bit position (e.g., using ECC or native correct match vector).

As determined in process block 607, in response to a detected error, then processing proceeds to process block 608 and then to process block 609; else in response to no detected error, then processing proceeds directly to process block 609. In process block 608, one or more of the content-addressable memory entries with detected errors are corrected, possibly re-programming all entries or all entries within a same block/bank.

The next single-bit position lookup operation is determined in process blocks 609-612. As determined in process block 609, if zero_flag is false, then processing proceeds to process block 610 and then returns to process block 603; else processing proceeds to process block 612 and then returns to process block 603. In process block 610, zero_flag is set to true (as both one and zero will have been searched for the current bit position next time processing returns to process block 609), and the bit of EC_lookup word at current bit position is set to zero. In process block 612, the current bit position is advanced (e.g., to a next bit in a predetermined sequence, which might be a first bit position) to search a new single-bit position, the bit of EC_lookup word at current bit position is set to one, and zero_flag is set to false. Processing returns to process block 603.

In view of the many possible embodiments to which the principles of the disclosure may be applied, it will be appreciated that the embodiments and aspects thereof described herein with respect to the drawings/figures are only illustrative and should not be taken as limiting the scope of the disclosure. For example, and as would be apparent to one skilled in the art, many of the process block operations can be re-ordered to be performed before, after, or substantially concurrent with other operations. Also, many different forms of data structures could be used in various embodiments. The disclosure as described herein contemplates all such embodiments as may come within the scope of the following claims and equivalents thereof.

What is claimed is:

1. A method, comprising:
    performing a lookup operation in a content-addressable memory to generate a match vector reflective of matching a current value at a single-bit position within each of a plurality of content-addressable memory entries of the content-addressable memory against a corresponding bit value at the single-bit position within a particular lookup word; and
    processing the match vector, independently of another match vector generated by another lookup operation in the content-addressable memory, to determine that at least one of the plurality of content-addressable memory entries has an error in the single-bit position;
    wherein each of the plurality of content-addressable memory entries includes a plurality of bit positions correspondingly programmed, prior to the lookup operation, with correct bit values for matching against lookup bit values at corresponding bit positions within a provided lookup word.

2. The method of claim 1, wherein said processing the match vector results in an identification of a single entry of said at least one of the plurality of content-addressable memory entries that has an error in the single-bit position.

3. The method of claim 2, further comprising the limitation of determining an error-correcting code for matching the corresponding bit value against said correct bit values said programmed at the single-bit position within each of the plurality of content-addressable memory entries; and
    wherein said processing the match vector includes determining the identification of the single entry based on the error-correcting code and the match vector.

4. The method of claim 3, further comprising the limitation of storing a correct matching value in the single entry in response to said determining the identification of the single entry.

5. The method of claim 2, further comprising the limitation of storing a correct matching value in the single entry in response to said determining the identification of the single entry.

6. The method of claim 2, further comprising the limitation of disabling the single entry in response to said determining the identification of the single entry.

7. The method of claim 1, wherein said performing the lookup operation includes using a global mask value to mask all bit positions except the single-bit position.

8. The method of claim 1, further comprising the limitation of storing a corresponding correct matching value in each of said at least one of the plurality of content-addressable memory entries in response to said determining that said at least one of the plurality of content-addressable memory entries has an error in the single-bit position.

9. The method of claim 1, further comprising the limitation of determining an error-correcting code for matching the corresponding bit value against said correct bit values said programmed at the single-bit position within each of the plurality of content-addressable memory entries; and
    wherein said processing the match vector includes determining that said at least one of the plurality of content-addressable memory entries has an error in the single-bit position based on the error-correcting code and the match vector.

10. The method of claim 9, further comprising the limitation of storing a corresponding correct matching value in each of said at least one of the plurality of content-addressable memory entries in response to said determining that said at least one of the plurality of content-addressable memory entries has an error in the single-bit position.

11. A method, comprising:
    for each particular single-bit position of a plurality of content-addressable memory entries of a content-addressable memory:
    performing a first lookup operation in the content-addressable memory to generate a first particular match vector reflective of matching a current value at said particular single-bit position within each of a plurality of content-addressable memory entries against a bit value of one at the single-bit position within a same or different first lookup word;
    processing the first particular match vector to determine that none of the plurality of content-addressable memory entries results in a matching error in said first lookup operation in the single-bit position;
    performing a second lookup operation in the content-addressable memory to generate a second particular match vector reflective of matching the current value at said particular single-bit position within each of the plurality of content-addressable memory entries against the bit value of zero at the single-bit position within a same or different second lookup word; and
    processing the second particular match vector, independent of the first particular match vector for said particular single bit-position, to determine that none of the plurality of content-addressable memory entries results in a matching error in said second lookup operation in the single-bit position;

wherein each of the plurality of content-addressable memory entries includes a plurality of bit positions correspondingly currently programmed, prior performing said first or second lookup operation at said particular single-bit position, with correct bit values for matching against lookup bit values at corresponding bit positions within a provided lookup word.

12. The method of claim 11, wherein said performing each of the first and second lookup operations includes using a global mask value to mask all bit positions except the single-bit position.

13. The method of claim 11, further comprising the limitations of:

determining a first error-correcting code for a matching value of one against said correct bit values said currently programmed at the single-bit position within each of the plurality of content-addressable memory entries; and determining a second error-correcting code for a matching value of zero against said correct bit values said currently programmed at the single-bit position within each of the plurality of content-addressable memory entries;

wherein said processing the first particular match vector includes determining that none of the plurality of content-addressable memory entries results in a matching error in said first lookup operation in the single-bit position based on the first particular match vector and the first error-correcting code; and wherein said processing the second particular match vector includes determining that none of the plurality of content-addressable memory entries results in a matching error in said second lookup operation in the single-bit position based on the second particular match vector and the second error-correcting code.

14. The method of claim 11, further comprising the limitations of:

performing a lookup operation in the content-addressable memory to generate a match vector reflective of matching a single-bit position within each of the plurality of content-addressable memory entries of the content-addressable memory against a corresponding bit value at the single-bit position within a current lookup word; and processing the match vector to determine that at least one of the plurality of content-addressable memory entries has an error in the single-bit position, and in response correcting each of said at least one of the plurality of content-addressable memory entries.

15. An apparatus, comprising:

a content-addressable memory performing a lookup operation in a plurality of content-addressable memory entries generating a match vector reflective of matching a current value at a single-bit position within each of a plurality of content-addressable memory entries against a corresponding bit value at the single-bit position within a lookup word; and a controller or error-correcting code machine processing the match vector, independently of another match vector generated by another lookup operation in the content-addressable memory, resulting in the determination that at least one of the plurality of content-addressable memory entries has an error in the single-bit position;

wherein each of the plurality of content-addressable memory entries includes a plurality of bit positions correspondingly programmed, prior to said performing the lookup operation, with correct bit values for matching against lookup bit values at corresponding bit positions within a provided lookup word.

16. The apparatus of claim 15, wherein said processing the match vector results in an identification of a single entry of said at least one of the plurality of content-addressable memory entries that has an error in the single-bit position, and in response storing a correct matching value in the single entry.

17. The apparatus of claim 16, wherein said processing includes determining the identification of the single entry based on the match vector and an error-correcting code for matching the corresponding bit value against said correct bit values said programmed at the single-bit position within each of the plurality of content-addressable memory entries.

18. The apparatus of claim 16, wherein said processing the match vector includes the controller providing the error-correcting code to the error-correcting code machine, the error-correcting code machine receiving the match vector, the error-correcting machine said determining the identification of the single entry, and the controller receiving from the error-correcting machine the identification of the single entry.

19. The apparatus of claim 18, further comprising the limitation of memory associated with the controller; and wherein said processing the match vector includes retrieving the error-correcting code from said memory.

20. The apparatus of claim 17, further comprising the limitation of memory associated with the controller; and wherein said processing the match vector includes retrieving the error-correcting code from said memory.

21. The method of claim 1, wherein said processing the match vector includes comparing the match vector to a predetermined correct match vector.

* * * * *